(12) United States Patent
Kimura et al.

(10) Patent No.: US 7,049,253 B1
(45) Date of Patent: May 23, 2006

(54) GLASS CLOTH AND PRINTED WIRING BOARD

(75) Inventors: Yasuyuki Kimura, Otsu (JP); Yoshinori Gondoh, Shiga (JP); Yoshinobu Fujimura, Kyoto (JP)

(73) Assignee: Asahi-Schwebel Co., Ltd., Osaka (JP)

( * ) Notice: Subject to any disclaimer, the term of this patent is extended or adjusted under 35 U.S.C. 154(b) by 0 days.

(21) Appl. No.: 10/031,183

(22) PCT Filed: Feb. 4, 2000

(86) PCT No.: PCT/JP00/00631

§ 371 (c)(1),
(2), (4) Date: Oct. 4, 2001

(87) PCT Pub. No.: WO00/60153

PCT Pub. Date: Oct. 12, 2000

(30) Foreign Application Priority Data

Apr. 5, 1999 (JP) ................................. 11-097233

(51) Int. Cl.
*D03D 15/00* (2006.01)

(52) U.S. Cl. ..................... 442/195; 442/189; 442/192; 428/901; 139/420 R

(58) Field of Classification Search ................ 442/189, 442/192, 195; 428/901; 139/420 R
See application file for complete search history.

(56) References Cited

U.S. PATENT DOCUMENTS 5,217,796 A * 6/1993 Kasai et al. ................. 442/186
5,662,990 A  9/1997 Scari et al.

FOREIGN PATENT DOCUMENTS

JP         05-286065        11/1993
(Continued)

OTHER PUBLICATIONS

JP 11-61596 English Translation Mar. 1999.*

*Primary Examiner*—Jenna-Leigh Befumo
(74) *Attorney, Agent, or Firm*—Finnegan, Henderson, Farabow, Garrett & Dunner,.L.L.P.

(57) ABSTRACT

The present invention is
(1) a glass cloth composed of a group of warp yarns and a group of weft yarns wherein one of the group of the warp and weft yarns are arranged with substantially no gap between the yarns, and, in that group, a width A (μm) of a cross-section of the yarn arranged with substantially no gap, a single-fiber diameter L (μm) of the yarn, the number N of single-fibers constituting the yarn and a weaving density C (ends/25 mm) of the glass cloth composed of the yarns satisfy the following equation (1-a):

$$C \times A/(25 \times L \times N) \geq 1.0, \text{ and} \quad (1\text{-}a)$$

(2) a glass cloth composed of a group of warp yarns and a group of weft yarns wherein both of the groups of the warp and weft yarns are arranged with substantially no gap between the yarns, and, in both the groups, a width A (μm) of a cross-section of the yarn, a single-fiber diameter L (μm) of the yarn, the number N of single-fibers constituting the yarn and a weaving density C (ends/25 mm) of the glass cloth satisfy the following equation (1-b):

$$C \times A/(25 \times L \times N) \geq 0.75. \quad (1\text{-}b)$$

The glass cloth according to the present invention is useful as a substrate for a printed wiring board. The printed wiring board using the glass cloth of the present invention as a substrate is capable of being bored with a laser beam to produce micro-holes (the roughness of the inner wall, the reproducibility and the roundness of the micro-holes are improved) therein, especially, is able to prepare uniform and small via-holes which are recently required for high-density wiring.

4 Claims, 1 Drawing Sheet

FOREIGN PATENT DOCUMENTS

| | | |
|---|---|---|
| JP | 09-111577 | 4/1997 |
| JP | 10-37038 | 2/1998 |
| JP | 10-272733 | 10/1998 |
| JP | 11-61596 | 3/1999 |
| JP | 11-315446 | 11/1999 |

* cited by examiner

GLASS CLOTH AND PRINTED WIRING BOARD

TECHNICAL FIELD

The present invention relates to a printed wiring board used in the electronic and electrical fields and, particularly, to a high density printed wiring board with small-diameter holes bored therein and to a glass cloth used therefor.

BACKGROUND ART

A printed wiring board, particularly a laminated printed wiring board, is constituted by laminating a plurality of insulating substrates, each carrying a conductive layer, with each other. The conductive layer provided between the insulation substrates is electrically connected to other optional conductive layers positioned on the upper or lower insulation substrates via conductive holes called through-holes, inner holes or blind holes. On the other hand, corresponding to the recent development of high performance and small-sized electronic equipments, a printed wiring board must be densely loaded with electronic elements. For the purpose of increasing the wiring density, the diameters of the via holes must be reduced.

However, when the diameter of the hole is reduced, and a conventional boring method is used, there are problems in that an inner wall of the bored hole is rough, a position of the hole is inaccurate, and inferior insulation may occur due to the entrance of a plating solution, used in the post plating process, through the inner wall of the hole. To solve these problems, in the past, various improvements have been made to the glass cloth and the matrix resin constituting the insulation substrate. For example, the adhessiveness of a glass cloth with a matrix resin can be improved by selecting a surface treatment agent, the distribution of glass fibers can be made uniform by the fiber-opening treatment and the heat durability can be improved by selecting a matrix resin having a high glass transition point (Tg).

The electronic equipment has become even more dense to require a small hole of 0.2 mm $\phi$ or less. However, when a drill corresponding to such a small hole is used, it is easily broken and must be frequently replaced, resulting in a lowering of the productivity. In addition, since the thickness of the insulation substrate is reduced to 0.1 mm or less because of the miniaturization of the printed wiring board, it is difficult to control the depth of the hole to an accuracy of 0.1 mm or less if a drill is used. This is particularly true of a blind via-hole provided in such a thin insulation substrate. Recently, a high density laminated printed wiring board, called a build-up wiring board, wherein an insulation layer and a conductor of 0.1 mm thick or less are sequentially piled up, has been developed, and a method for boring holes in this wiring board by a laser beam has been proposed and carried out.

However, since this build-up wiring board generally has no glass cloth, the dimensional stability and the heat durability are largely degraded, and since a process different from the conventional process is necessary for forming a build-up layer, the production cost is high. Thus, the development of glass cloth having a thickness of 0.1 mm or less, enabling a laminated printed wiring board containing the glass cloth to be bored by using a laser beam, is required.

Generally speaking, an insulation substrate for a printed wiring board is a composite material consisting of a matrix resin composed of organic material and a glass cloth composed of inorganic material, wherein the organic and inorganic materials unevenly exist. Accordingly, the respective materials are unevenly processed during the boring with a laser beam to roughen the inner wall of the hole and deteriorate the reliability of the plating conductivity. This is because the organic material portion and the inorganic material portion have different physical properties such as absorptivity of laser beam energy, decomposition temperature or heat-dispersibility.

As a countermeasure thereto, the process conditions are properly selected to have well-bored holes. However, in the insulation substrate in which the organic matrix resin and the inorganic glass cloth are unevenly distributed in the surface direction, an improvement in process uniformity of the bored holes has not yet been achieved.

To improve the surface-directional evenness, the formation of glass cloth having no gaps has been attempted by increasing a weaving density of the cloth. Accordingly, the uniformity of the respective holes is improved but the processibility is lowered due to the increase in an amount of glass, which also results in an increase in cost.

Recently, IC packages have been high-lighted as a novel use of a high density wiring board necessitating micro-holes. Of them, an area-array type IC package such as BGA or CSP is of a substantially square shape and is required to have the same mechanical properties both in horizontal and vertical directions. Particularly, a thermal expansion coefficient of a laminated board having a significant influence on the connection reliability is required to have the same values in the vertical and horizontal directions. Thus, a weaving density of a glass cloth is required to have nearly equal values both in the warp and weft directions, and a yarn configuration, including flatness and widening degree, must be approximately equal in both the directions.

DISCLOSURE OF THE INVENTION

An object of the present invention is to provide a glass cloth capable of being bored by a drill or, particularly, by a laser beam to have uniform micro-holes such as through-holes, inner via-holes or blind via-holes in a high-density printed wiring board, and a printed wiring board using such a glass cloth as a substrate.

The present inventors have diligently studied the above problem and found that it is necessary to specify a width of a cross-section of a glass fiber yarn and a weaving density of the glass cloth to unify the weave structure thereof in the surface direction for obtaining a laminated board excellent in surface smoothness which is indispensable for improving the processibility when a micro-hole is bored. This is particularly true when a laser beam is used, because the removal of a glass component is facilitated and the setting of proper process conditions is enhanced.

That is, the present invention is

1. A glass cloth composed of a group of warp yarns and a group of weft yarns wherein one of the group of the warp and weft yarns are arranged with substantially no gap between the yarns, and, in that group, a width A (μm) of a cross-section of the yarn arranged with substantially no gap, a single-fiber diameter L (μm) of the yarn, the number N of single-fibers constituting the yarn and a weaving density C (ends/25 mm) of the glass cloth composed of the yarns satisfy the following equation (1-a):

$$C \times A/(25 \times L \times N) \geq 1.0 \quad \text{(1-a)}$$

2. A glass cloth composed of a group of warp yarns and a group of weft yarns wherein both of the groups of the warp and weft yarns are arranged with substantially no gap between the yarns, and, in both the groups, a width A (μm) of a cross-section of the yarn, a single-fiber diameter L (μm) of the yarn, the number N of single-fibers constituting the yarn and a weaving density C (ends/25 mm) of the glass cloth satisfy the following equation (1-b):

$$C \times A/(25 \times L \times N) \geq 0.75 \tag{1-b}$$

3. A glass cloth as defined by claim 1 or 2, wherein a warp density Ct (ends/25 mm) and a weft density Cy (ends/25 mm) satisfy the following equation (2):

$$0.9 \leq Ct/Cy \leq 1.1 \tag{2}$$

4. A glass cloth as defined by claim 1, 2 or 3 wherein a diameter of the single-fiber of the glass fiber yarn constituting the glass cloth has a thickness of nominal diameter D defined by JIS-R-3413 or less.

5. A printed wiring board wherein the glass cloth defined by any one of claims 1 to 4 is used as a substrate.

In the present invention, a width A of a cross-section of the yarn is a distance A shown in FIG. 1.

In this regard, the present invention will be described in more detail below.

(i) Characteristics of Glass Cloth

A glass cloth is generally of a plain weave structure in which warp yarns and weft yarns are positioned alternately above and beneath the other and there are three kinds of portions in the glass cloth; a portion at which warp and weft yarns are overlapped with each other, a portion in which either one of warp and weft yarns exists, and a portion, in which no glass yarns exist, called a basket hole and which is encircled with the warp yarns and the weft yarns. To obtain a printed wiring board capable being bored with favorable micro-holes, it is important that glass fibers are uniformly distributed in the surface direction of the insulation substrate. Thereby, it is necessary to arrange at least one of the warp yarn group and the weft yarn group constituting the glass cloth with substantially no gap between them.

However, when the shapes of the warp yarn and the weft yarn resemble each other for homogenizing the woven fabric, a distance between adjacent yarn in one group is influenced by a thickness of a yarn transverse thereto because the warp and weft yarns are alternately positioned above and beneath the other. Thus, a state wherein gaps are minimized simultaneously between the adjacent yarns in both the warp and weft yarn groups, that is, a state of yarns arranged with substantially no gap is defined by the following equation (3):

$$(A+Bc) \times C/1000 \geq 25 \tag{3}$$

wherein A is a width (μm) of the yarn, Bc is a thickness (μm) of the yarn transverse to the former yarn and C is a weaving density (ends/25 mm) of the former yarn.

Preferably, $28 \geq (A+Bc) \times C/1000 \geq 25$ is satisfied. That is, if a left side of the equation is smaller than 25 (mm) which is a unit length representing the weaving density of the glass cloth, it means that a gap exists, between the adjacent yarns, which is larger than a thickness of a yarn transverse to the former yarns. Such a gap is solely filled with a resin layer to adversely effect the processibility of the glass cloth. When a laser beam is used, it is difficult to have uniform holes bored thereby since the resin portion and the glass portion are different in processibility. Contrarily, if the result exceeds 28 (mm), the undulation of the other yarn group is suppressed to cause the adverse effect on the uniformity of the glass cloth in the thickness-wise direction as well as to deteriorate the smoothness thereof.

To achieve the relationship defined by the above-mentioned equation (3) without increasing an amount of glass in the insulation substrate, the yarn is preferably sufficiently flattened. The sufficient flattening used in this text is defined as follows:

A maximum width W1 occupied by a yarn composed of N ends of single-fibers having a diameter L (μm) is represented by the following equation (4):

$$N \times L = W1 \tag{4}$$

wherein the single-fiber diameter L (μm) is a nominal diameter shown in JIS-R-3413.

Accordingly, a flattening ratio F is represented by F=A/W1, wherein A (μm) is a width of a yarn cross-section.

However, the flattened state of the yarn is also influenced by the weaving density of the yarn; that is, the higher the weaving density, the smaller the gap between the adjacent yarns, whereby a less space is left to allow the yarn to widen. Contrarily, the lower the weaving density, the larger the gap, whereby a more space is left to allow the yarn to widen. A yarn width W2 (mm) widened to a maximum extent which is inevitably determined by the weaving density is defined by the following equation (5) and used as an indicator of yarn flatness:

$$25/C = W2 \tag{5}$$

From these factors, a substantial flattening ratio Ft is represented by the following equation (6), and if both the warp and weft yarns are flattened, both the yarns satisfy the following equation (7):

$$Ft = F/W2 = A/(W1 \times W2) \tag{6}$$

$$Ft \geq 0.75 \tag{7}$$

In other words, if both the warp and weft yarns have Ft of 0.75 or more, all the surface of the glass cloth is completely covered with the flattened warp and weft yarns, and thus the distribution of glass fibers in the glass cloth becomes uniform to facilitate the processibility thereof. Preferably, if Ft is 0.8 or more, the flattening is more sufficient and uniform.

From the above equation (6), Ft may also be represented as follows:

$$Ft = C \times A/(25 \times L \times N)$$

If either one of the warp and weft yarns is particularly flattened to satisfy the following equation (8), it is defined that the glass fibers are uniformly distributed to evenly cover the glass cloth as a whole:

$$Ft \geq 1.0 \tag{8}$$

In other words, if either one of the warp and weft yarns has Ft of 1.0 or more, the glass cloth is as a whole covered with the flattened yarns and, thus the glass fibers are uniformly distributed in the glass cloth to facilitate the processibility of the glass cloth. Preferably, when Ft is 1.2 or more, the flattening and the uniformity become sufficient.

In such a manner, the weaving density and the widening of the yarn are closely related to each other, and an optimum glass cloth having suitable basis weight and thickness can be selected in accordance with the requirements for the layered structure of the laminated board.

If a warp-wise weaving density (hereinafter represented by Ct (ends/25 mm)) and a weft-wise weaving density (hereinafter represented by Cy (ends/25 mm)) satisfy the following equation (9), a glass cloth satisfying the recent demand for the warp- and weft-wise uniformity of the laminated board is obtainable. Further, to suppress the weft-wise shrinkage of the woven glass cloth, the following equation (10) is preferably satisfied.

$$0.9 \leq Ct/Cy \leq 1.1 \quad (9)$$

$$1.0 \leq Ct/Cy \leq 1.1 \quad (10)$$

The smaller a single-fiber diameter of the glass fiber yarn constituting the glass cloth, the easier the uniform dispersion of the fibers. Also, the smaller the fiber diameter, the smaller the boring resistance when the printed wiring board is bored by a drill. Further, when the laser beam is used, the removal of glass becomes easier. That is, a nominal diameter of a glass fiber is E or less, preferably D or less as defined by JIS-R-3413 in view of the boring of micro-holes.

(ii) Preparation of Glass Cloth:

The glass fiber yarn used for manufacturing the glass cloth according to the present invention is twisted at a smaller number of twists in a unit length in a range from 0.5 turns/25 mm or less, preferably in a range from 0.3 to 0 turns/25 mm than the conventional glass fiber yarn having the number of twists in a range from 0.7 to 1.0 turns/25 mm. Thus, the twisted yarn can easily widen to form a fabric structure in which every adjacent yarn in the warp and weft is substantially in close contact with another with substantially no gap. Also, by using a yarn having a smaller number of twists, the yarn is liable to flatten so that the cross-section thereof approaches that of a flat sheet rather than an oval shape, whereby the distribution of the glass fibers in the glass cloth becomes more uniform.

The flattening of glass cloth may be enhanced by a fiber-opening process, for example, by the application of hydraulic pressure due to a water flow, the high-frequency vibration through a liquid medium, the injection of fluid having a surface pressure or the roll pressure, whereby the width of the twisted yarn becomes more broad to result in a fabric structure in which adjacent yarns are arranged with substantially no gap in both the warp- and weft-wise directions. Also, the yarn is flattened to have a cross-section similar to that of a flat sheet rather than an oval shape, whereby the distribution of the glass fibers in the glass cloth becomes more uniform, which effect is the same as that obtained by using a yarn having a smaller number of twists. Moreover, a glass cloth prepared from glass fiber yarns applied with an organic lubricant or having a binder or a sizing agent conventionally used in the weaving process (a so-called gray fabric) may be effectively flattened by the combination of these means. Also, a combination of both the means is particularly effective.

(iii) Composition of Glass Cloth:

While a so-called E glass (non-alkali glass) is generally used for preparing a glass cloth of a laminated board for a printed wiring board or others, D glass, S glass or high-dielectric constant glass may be used without deteriorating the effect of the present invention.

(iv) Production of Laminated Board

The printed circuit board according to the present invention may be produced in accordance with a conventional method. For example, the glass cloth is impregnated with a matrix resin such as epoxy resin to form a resin-impregnated prepreg. A plurality of such prepregs are laminated together, or one or more of them is layered on an inner-layer core sheet, and heated and pressed to be integral with each other, which process is repeated if necessary.

Resins used for preparing the printed wiring board include thermosettable resin such as epoxy resin, unsaturated polyester resin, polyimide resin, bismaleimidetriazine (BT) resin or cyanate resin, thermoplastic resin such as polyphenylene oxide (PPO) resin, polyetherimide resin or fluorine resin, and mixtures thereof. An inorganic filler such as aluminum hydroxide may be mixed with the above resin.

BEST MODE FOR CARRYING OUT THE INVENTION

Figure 1:
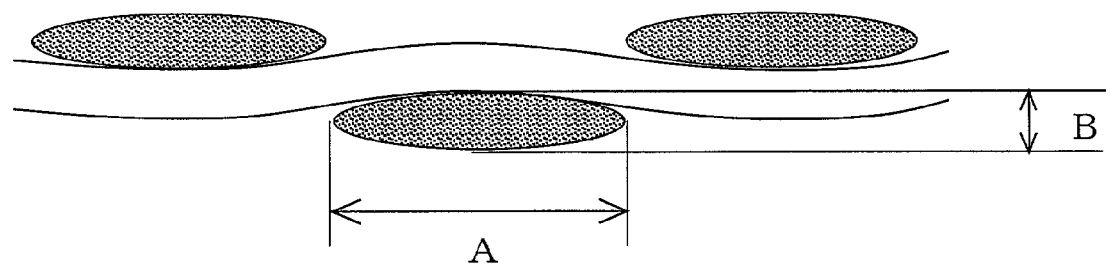
FIG. 1 is a schematic illustration for describing the relationship between glass fiber yarns constituting a glass cloth and a width and a thickness of the cross-section of warp and weft yarns, wherein A denotes a width of the yarn cross-section and B denotes a yarn thickness.

The present invention will be described in more detail below, but is not limited thereto.

A method for measuring physical properties of a glass cloth, a width and a thickness of a cross-section of a glass fiber yarn, a method for preparing a laminated board from the glass cloth and a test method are as follows:

1. The physical properties of a glass cloth were measured in accordance with JIS-R-3420.

2. Measurement of cross-sectional width and thickness of warp and weft yarns:

The glass cloth was embedded in cold-setting epoxy resin, and cut and polished so that a cross-section of the glass fiber yarn appeared, and a photograph was taken by an electron microscope (Type S-570 manufactured by K.K. HITACHI SEISAKUSHO), from which the width and the thickness were measured.

3. Preparation of a laminated board for a printed wiring board:

A 0.4 mm thick sheet clad with 35 µm thick copper foil on both sides was subjected to a blacking treatment to become an inner-layer core sheet. Then, the glass cloth was impregnated with epoxy resin varnish, and dried to become a prepreg. A pair of such prepregs were layered on opposite sides of the core sheet, respectively. Copper foil of 18 µm thick was layered on the respective side thereof, and heated and pressed at 175° C. and 40 kg/cm² to result in a laminated board.

4. Estimation of processibility of printed wiring board:

A laminated board was prepared by the method described in 3 above and bored with micro-holes solely in the surface layer thereof by means of a carbon-oxide gas laser under the condition of a diameter of 0.145 mm φ, a frequency of 500 Hz, a pulse energy of 18 J/cm² and a shot number of 6 (using Type LAVIA 1000 TW manufactured by SUMITOMO JUKIKAI KOGYO Co. Ltd.).

After the boring, a surface and a cross-section of the hole were observed in the same way as the cross-section of the glass cloth, and characteristics were estimated. The estimated characteristics were the roughness of the inner wall and the reproducibility of the hole. In this regard, the roughness of the inner wall is represented by the difference in height between convex and concave portions in the inner wall of the hole, and the reproducibility is represented by a standard deviation of the diameters of the bottoms of the holes.

EXAMPLE 1

A glass cloth was woven by an air jet loom from warp and weft yarns of C1200 1/0 1.0 Z at a warp density of 69 ends/25 mm and a weft density of 69 ends/25 mm. The resultant gray fabric was continuously subjected to a flattening treatment through a press roll at a line pressure of 300 N/cm and then to a fiber-opening treatment by a high-pressure water spray at a pressure of 200N/cm². Thereafter, the glass cloth was desized at 400° C. for 24 hours.

Subsequently, the glass cloth was dipped into a solution of silane coupler (SZ6032, manufactured by Toray•Dow Corning K.K.) as a surface treatment agent, squeezed and dried at 120° C. for 1 minute to result in the finished glass cloth having a basis weight of 24 g/m² and a thickness of 0.028 mm. Therefrom, a laminated board was prepared as described above.

EXAMPLE 2

A glass cloth was woven by an air jet loom from warp and weft yarns of C900 1/0 1.0 Z at a warp density of 69 ends/25 mm and a weft density of 69 ends/25 mm. The resultant gray fabric was subjected to a fiber-opening treatment by a high-pressure water spray at a pressure of 200N/cm². Thereafter, the glass cloth was desized at 400° C. for 24 hours.

Subsequently, the glass cloth was subjected to a surface treatment in the same manner as in Example 1 to result in the finished glass cloth having a basis weight of 30 g/m² and a thickness of 0.030 mm. Therefrom, a laminated board was prepared as described above.

EXAMPLE 3

A glass cloth was woven by an air jet loom from warp and weft yarns of D900 1/0 1.0 Z at a warp density of 69 ends/25 mm and a weft density of 69 ends/25 mm. The resultant gray fabric was subjected to a fiber-opening treatment by a high-pressure water spray at a pressure of 150N/cm². Thereafter, the glass cloth was desized at 400° C. for 24 hours.

Subsequently, the glass cloth was subjected to a surface treatment in the same manner as in Example 1 to result in the finished glass cloth having a basis weight of 30 g/m² and a thickness of 0.032 mm. Therefrom, a laminated board was prepared as described above.

EXAMPLE 4

A glass cloth was woven by an air jet loom from warp and weft yarns of D450 1/0 0.3 Z at a warp density of 54 ends/25 mm and a weft density of 54 ends/25 mm. The resultant gray fabric was subjected to a fiber-opening treatment by a high-pressure water spray at a pressure of 300N/cm². Thereafter, the glass cloth was desized at 400° C. for 24 hours.

Subsequently, the glass cloth was subjected to a surface treatment in the same manner as in Example 1 to result in the finished glass cloth having a basis weight of 48 g m² and a thickness of 0.042 mm. Therefrom, a laminated board was prepared as described above.

COMPARATIVE EXAMPLE 1

A glass cloth was woven by an air jet loom from warp and weft yarns of D450 1/0 1.0 Z at a warp density of 60 ends/25 mm and a weft density of 46 ends/25 mm. Thereafter, the glass cloth was desized at 400° C. for 24 hours.

Subsequently, the glass cloth was subjected to a surface treatment in the same manner as in Example 1 to result in the finished glass cloth having a basis weight of 48 g/m² and a thickness of 0.055 mm. Therefrom, a laminated board was prepared as described above.

COMPARATIVE EXAMPLE 2

A glass cloth was woven by an air jet loom from warp and weft yarns of D900 1/0 1.0 Z at a warp density of 56 ends/25 mm and a weft density of 56 ends/25 mm. Thereafter, the glass cloth was desized at 400° C. for 24 hours.

Subsequently, the glass cloth was subjected to a surface treatment in the same manner as in Example 1 to result in the finished glass cloth having a basis weight of 25 g/m² and a thickness of 0.038 mm. Therefrom, a laminated board was prepared as described above.

The physical properties and the estimation results were shown in Tables 1 and 2.

TABLE 1

| | Items | | | | | | | | | | | | | | | |
|---|---|---|---|---|---|---|---|---|---|---|---|---|---|---|---|---|
| | Constitution of glass cloth | | | | | | | | | | | | | | | |
| | Single fiber diameter L (μm) | | Number of single fiber N (ends) | | Weaving density C (ends/25 mm) | | | Width of yarn cross-section A (μm) | | Thickness of yarn cross-section B (μm) | | (A + Bc) × C/1000 | | Ft | | Processability Roughness of inner wall (μm) | Variability of hole diameter (μm) |
| Ex. No. | Warp yarn | Weft yarn | Warp yarn | Weft yarn | Warp yarn | Weft yarn | Ct/Cy | Warp yarn | Weft yarn | Warp yarn | Weft yarn | Warp yarn | Weft yarn | Warp yarn | Weft yarn | | |
| Example 1 | 4.5 | 4.5 | 100 | 100 | 69 | 69 | 1.0 | 161 | 352 | 18 | 11 | 12 | 26 | 0.99 | 2.16 | 1.8 | 3.5 |
| Example 2 | 4.5 | 4.5 | 144 | 144 | 69 | 69 | 1.0 | 204 | 354 | 18 | 15 | 15 | 26 | 0.86 | 1.51 | 2.1 | 4.0 |
| Example 3 | 5 | 5 | 100 | 100 | 69 | 69 | 1.0 | 214 | 356 | 19 | 16 | 16 | 26 | 1.18 | 1.97 | 4.5 | 4.4 |
| Example 4 | 5 | 5 | 200 | 200 | 54 | 54 | 1.0 | 386 | 464 | 27 | 19 | 22 | 27 | 0.83 | 1.00 | 7.4 | 5.4 |

TABLE 2

| | | | | | | | Constitution of glass cloth | | | | | | | | | Processability | |
|---|---|---|---|---|---|---|---|---|---|---|---|---|---|---|---|---|---|
| | Single fiber diameter L (μm) | | Number of single fiber N (ends) | | Weaving density C (ends/25 mm) | | | Width of yarn cross-section A (μm) | | Thickness of yarn cross-section B (μm) | | (A + Bc) × C/1000 | | Ft | | | Variability |
| | | | | | Ct | Cy | | | | | | | | | | Roughness of inner | of hole diameter |
| Ex. No. | Warp yarn | Weft yarn | Warp yarn | Weft yarn | Warp yarn | Weft yarn | Ct/Cy | Warp yarn | Weft yarn | Warp yarn | Weft yarn | Warp yarn | Weft yarn | Warp yarn | Weft yarn | wall (μm) | (μm) |
| Comparative example 1 | 5 | 5 | 200 | 200 | 60 | 46 | 1.3 | 264 | 350 | 37 | 34 | 18 | 18 | 0.63 | 0.64 | 16.5 | 16.0 |
| Comparative example 2 | 5 | 5 | 100 | 100 | 56 | 56 | 1.0 | 199 | 285 | 26 | 17 | 12 | 17 | 0.88 | 1.27 | 9.3 | 13.8 |

CAPABILITY OF EXPLOITATION IN INDUSTRY

According to the present invention, it is possible to improve the processability of a printed wiring board particularly when a laser beam is used for boring micro-holes (that is, the roughness of the inner wall, the reproducibility and the roundness of the micro-holes are improved). Since the glass fibers are uniformly distributed in the glass cloth, a required printed wiring board for high-density wiring, capable of uniformly and reproducibly being bored with small via-holes, is provided.

What is claimed is:

1. A glass cloth composed of a group of warp yarns and a group of weft yarns, wherein a diameter of a single fiber of the warp and weft yarns has a thickness of nominal diameter D or less as defined by JIS-R-3413, and wherein one of the group groups of the warp and weft yarns is arranged with substantially no gap between the yarns, and in that group, a width A (μm) of a cross-section of a yarn in that group, a single-fiber diameter L (μm) of a yarn in that group, the number N of single-fibers constituting a yarn in that group and a weaving density C (ends/25 mm) of the glass cloth satisfy the following equation (1-a):

$$C \times A/(25 \times L \times N) \geq 1.0 \tag{1-a}$$

2. A glass cloth composed of a group of warp yarns and a group of weft yarns, wherein a diameter of a single fiber of the warp and weft yarns has a thickness of nominal diameter D or less as defined by JIS-R-3413, and wherein both of the groups of the warp and weft yarns are arranged with substantially no gap between the yarns, and in both the groups, a width A (μm) of a cross-section of a yarn, a single-fiber diameter L (μm) of a yarn, the number N of single-fibers constituting a yarn and a weaving density C (ends/25 mm) of the glass cloth satisfy the following equation (1-b):

$$C \times A/(25 \times L \times N) \geq 0.75 \tag{1-b}$$

3. A glass cloth as defined by claim 1 or 2, wherein a warp density Ct (ends/25 mm) and a weft density Cy (ends/25 mm) satisfy the following equation (2):

$$0.9 \leq Ct/Cy \leq 1.1 \ldots \tag{2}$$

4. In a printed wiring board, the improvement comprising a substrate for the board made from the glass cloth of claim 1 or 2.

* * * * *